(12) United States Patent
Sakata et al.

(10) Patent No.: US 6,586,335 B1
(45) Date of Patent: Jul. 1, 2003

(54) THIN FILM TRANSISTOR AND METHOD OF MANUFACTURING THE SAME

(75) Inventors: Kazuyuki Sakata, Tokyo (JP); Kazunori Inoue, Tokyo (JP); Takeshi Morita, Tokyo (JP); Hitoshi Nagata, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/645,981

(22) Filed: Oct. 11, 2000

Related U.S. Application Data

(63) Continuation of application No. 08/922,099, filed on Sep. 2, 1997, now Pat. No. 5,826,969.

(30) Foreign Application Priority Data

May 30, 1997 (JP) ............................................. 9/142247

(51) Int. Cl.⁷ ............................................... H01L 29/72
(52) U.S. Cl. ...................... 438/689; 438/701; 438/713; 438/735
(58) Field of Search ................................. 257/347, 349, 257/350, 351; 438/689, 701, 713, 735

(56) References Cited

U.S. PATENT DOCUMENTS

| | | | | |
|---|---|---|---|---|
| 4,842,372 A | * | 6/1989 | Toyama | 257/347 |
| 5,905,274 A | * | 5/1999 | Ahn et al. | 257/59 |

FOREIGN PATENT DOCUMENTS

| | | | | |
|---|---|---|---|---|
| JP | 61-168960 | * | 7/1986 | 257/347 |
| JP | 7-86230 | | 3/1995 | |

* cited by examiner

*Primary Examiner*—Edward Wojciechowicz
(74) *Attorney, Agent, or Firm*—Oblon, Spivak, McClelland, Maier & Neustadt, P.C.

(57) ABSTRACT

A thin film transistor includes: a substrate, a gate electrode, an insulating film, a semiconductor film, a source electrode, a drain electrode, wherein in at least one electrode of the gate electrode, the source electrode and the drain electrode, end portion of the at least one electrode is tapered in such a manner that a thickness decreases in a direction toward end face of the at least one electrode, the at least one electrode being composed of one electrode material, and prescribed physical property of the at least one electrode being changed in a direction perpendicular to a surface of the at least one electrode, so that an etching rate of the at least one electrode is changed in the direction.

7 Claims, 5 Drawing Sheets

THIN FILM TRANSISTOR AND METHOD OF MANUFACTURING THE SAME

This application is a continuation of Ser. No. 08/922,099 filed Sep. 2, 1997 now U.S. Pat. No. 5,826,969.

BACKGROUND OF THE INVENTION

The present invention relates to a thin film transistor (hereinafter referred to as TFT) for a liquid crystal display apparatus and to a method of manufacturing the TFT. More particularly, the present invention relates to a TFT in which a shape of a cross-section of the electrode line pattern is etched to be a tapered shape and to a method of forming an electrode line in which an etching rate is varied to a direction of film thickness by varying a film quality to a direction of film thickness in forming an electrode line.

DISCUSSION OF THE BACKGROUND

FIGS. 5(a) through 5(d) are sectional drawings showing composition of a conventional TFT provided in a conventional TFT liquid crystal display. In FIGS. 5(a) through 5(d) a reference numeral 1 denotes a substrate, numeral 2 denotes a first electrode line, numeral 3 denotes an insulating film, numeral 4 denotes an amorphous silicon (hereinafter referred to as a-Si) semiconductor film, numeral 5 denotes $n^+$ type a-Si semiconductor film, numeral 6 denotes a contact hole for forming a channel, numeral 7 denotes a second electrode line, numeral 8 denotes a passivation film, numeral 9 denotes a resist (photo resist). Further, the first electrode line is to be a gate electrode and the second electrode line is to be a source electrode and a drain electrode.

TFT liquid crystal display comprises a thin film transistor array substrate (hereinafter referred to as "TFT array substrate") on which TFTs normally composed of a semiconductor thin film (hereinafter referred to as semiconductor film) are provided, an opposite substrate arranged to be opposite to the TFT array substrate and a liquid crystal material interposed between the TFT array substrate and the opposite substrate.

So as to display various picture image as a display apparatus, the central area of the TFT array substrate is assigned to be a display area and in the display the TFTs and pixel electrodes are provided in a matrix manner to each pixel so as to apply a voltage to each pixel which is a minimum unit of picture image. Signal lines such as gate lines, source lines and so on are provided between pixels in such a manner that gate lines are provided in parallel to each other and source lines are provided in parallel to each other.

Further, an alignment film and a storage capacitance if necessary are provided on the TFT array substrate. An opposite electrode, color filters, black matrices and so on are provided on the opposite substrate.

The liquid crystal display (hereinafter referred to as LCD) in which such a TFT array substrate is employed is referred to a TFT-LCD.

A method of manufacturing the TFT including each composition is explained below.

First, a first electrode line 2 is formed on a substrate 1 composed of glass and so on as an insulating substrate. The first electrode line 2 is deposited in such a manner in which a metal material composed of for example chrome and so on is deposited by a sputtering method so that the film quality is uniform. Thereafter, a patterned resist (photo resist) 9 is formed; a chemical etchant composed of ammonium cerium nitrate and nitric acid is sprayed on the film; and the first electrode line 2 is formed by etching, so that an end portion of the first electrode line 2 is tapered by subjecting to errosion operation by the chemical etchant. At this moment, a tapered surface is a slant surface crossing to a perpendicular line of the surface of the substrate 1 with a certain range of degrees. The certain range of degrees, i.e., a taper angle exist approximately from 10 degrees to 45 degrees. Therefore, a shape of the cross-section of the first electrode line 2 is a shape in which a thickness (in a direction perpendicular to a surface of the first electrode line) decreases in a direction toward end face 18 (shown in FIG. 1(a)) of the first electrode line so that a length $L_2$ of a bottom portion of the first electrode line is shorter than a length $L_1$ of a top portion of the first electrode line ($L_2 > L_1$). Vicissitudes of the shapes of the TFT are shown in FIGS. 5(a) through 5(c).

Thereafter, the insulating film 3 composed of silicon nitride and so on is formed and the TFT array substrate in process is cleaned chemically or physically. When cleaning physically, the TFT array substrate in process is cleaned for example by a scrubber. Next, a semiconductor layer, i.e., amorphous silicon (a-Si) semiconductor film 4 and another semiconductor layer, i.e., $n^+$ type a-Si semiconductor film 5 is formed on the insulating film 3; a contact hole 6 is provided; and a second electrode line 7 is formed in the similar manner as the method in which the first electrode line 2 is formed. Finally, a passivation film 8 is formed to be TFT structure shown in FIG. 5(d).

Among the above-mentioned method for manufacturing the TFT, when forming metal materials for the first eletrode line 2 and the second electrode line 7 by a sputtering method, a plurality of targets can be employed. The compositions of the targets are different from each other. The target is shaped into like a plate so that a material which is to be deposited on a substrate and so on is attacked by argon gas to deposit the material. So as to deposit a film the composition of which is different gradually, such targets the composition of which are different from each other are employed. The word "gradually" means that a plurality of depositing steps are performed successively without taking out semiconductor products in process from the depositing apparatus.

In order to manufacture the liquid crystal display apparatus in which there is employed such a TFT array substrate that the TFTs, gate lines, source lines and other common lines are provided in matrix manner on a glass substrate to assign a display area, and input terminals, auxiliary lines, TFT drive circuits and so on on a periphery of the display area. At this moment, electric conductive thin films (hereinafter, referred to as "conductive film") and insulating thin film (hereinafter, referred to as "insulating film") if necessary are provided so as to obtain the functions respectively. An opposite electrodes are provided on the opposite substrate. Further, color filters and black matrices are also provided on the opposite substrate.

Liquid crystal display apparatus is manufactured in such a manner that the TFT array substrate and the opposite substrate is manufactured; the TFT array substrate and the opposite substrate are adhered on the periphery of the TFT array substrate and the periphery of the opposite substrate with the distance between the TFT array substrate and the opposite substrate being kept a desired gap so that a liquid crystal material is injected between the TFT array substrate and the opposite substrate.

In the method described above manufacturing the TFT, processing condition data of etching step is controlled so as to control the taper angle of the electrode line such as the first electrode line, the second electrode line and so on (hereinafter, referred to as "electrode line" for a general term), within a desired range of angle.

That is to say, since the taper angle cannot be controlled within the desired range of angle if impurities caused by etching are accumulated in chemical etchant, it is required either such a manner that the chemical etchant is exchanged to new or such a manner that a plurality of targets are prepared, allowing a frequency of exchanging to be increased, the used chemical etchant composed of ammonium cerium nitrate and nitric acid must be exchanged for fresh chemical etchant frequently (one time or two times a day) so as to keep impurities concentration in the chemical etchant below a given amount.

There arises a problem that checking of exchanging such chemical etchant and impurities concentration requires very large production cost in the etching step. Further, there arises another problem that a number of targets employed in deposition step cannot be reduced.

SUMMARY OF THE INVENTION

The present invention is achieved in order to solve the above-mentioned problem.

The object of the present invention is tp realize a TFT of low manufacturing cost and the method of manufacturing the same by reducing the frequency of exchanging the chemical etchant employed in etching step or by reducing a number of targets (one piece).

One aspect of the present invention is directed to a thin film transistor comprising:

a substrate, a gate electrode formed on the substrate, an insulating film formed on the gate electrode and the substrate except for whole of outer surface of the gate electrode, a semiconductor film formed on the insulating film, a source electrode partially connected to the semiconductor film, a drain electrode partially connected to the semiconductor film, wherein in at least one electrode of the gate electrode, the source electrode and the drain electrode, end portion of the at least one electrode is tapered in such a manner that a thickness decreases in a direction toward end face of the at least one electrode, the at least one electrode being composed of one material, and prescribed physical property of the at least one electrode being changed in a direction perpendicular to a surface of the at least one electrode, so that an etching rate of the at least one electrode is changed in the direction.

Preferably, the prescribed physical property of the at least one electrode is changed continuously in the direction.

Preferably, the prescribed physical property of the at least one electrode is changed in such a manner that atomic density is changed.

Preferably, the prescribed physical property of the at least one electrode is changed in such a manner that crystal orientation is changed.

Preferably, the prescribed physical property of the at least one electrode is changed in such a manner that bulk resistance is changed.

Preferably, the prescribed physical property of the at least one electrode is changed gradually in the direction.

Preferably, the prescribed physical property of the at least one electrode is changed in such a manner that atomic density is changed.

Preferably, the prescribed physical property of the at least one electrode is changed in such a manner that crystal orientation is changed.

Preferably, the prescribed physical property of the at least one electrode is changed in such a manner that bulk resistivity is changed.

Preferably, the at least one electrode is composed of one memeber selected from a group comprising chrome, aluminum, aluminum alloy, molybdenum, tantalum and titanium.

Another aspect of the present invention is directed to a thin film transistor comprising:

a substrate, a gate electrode formed on the substrate, an insulating film formed on the gate electrode and the substrate except for whole of outer surface of the gate electrode, a semiconductor film formed on the insulating film, a source electrode partially connected to the semiconductor film, and a drain electrode partially connected to the semiconductor film, wherein in at least one electrode of the gate electrode, the source electrode and the drain electrode, end portion of the at least one electrode is tapered in such a manner that thickness decreases in a direction toward end face of the at least one electrode, the at least one electrode comprising two-layer electrode, each one electrode layer of the two-layer electrode being composed of one material, and prescribed physical property of the each one layer being changed in a direction perpendicular to a surface of the each one layer, so that an etching rate of the each one layer is changed in the direction.

Preferably, the each one layer of the two-layer electrode is composed of one member selected from a group comprising chrome, aluminum, aluminum alloy, molybdenum tantalum and titanium.

Still another aspect of the present invention is to a method of manufacturing a thin film transistor comprising:

a substrate, a gate electrode formed on the substrate, an insulating film formed on the gate electrode and the substrate except for whole of outer surface of the gate electrode, a semiconductor film formed on the insulating film, a source electrode partially connected to the semiconductor film, a drain electrode partially connected to the semiconductor film, wherein in at least one electrode of the gate electrode, the source electrode and the drain electrode, end portion of the at least one electrode is tapered in such a manner that a thickness decreases in a direction toward end face of the at least one electrode, the at least one electrode being composed of one material, and prescribed physical property of the at least one electrode being changed in a direction perpendicular to a surface of the at least one electrode comprising steps of:

(a) changing the prescribed physical property of the at least one electrode in a direction perpendicular to a surface of the at least one electrode, so that an etching rate of the at least one electrode is changed in the direction, and (b) etching the at least one electrode to be tapered.

Preferably, in depositing the at least one electrode by a sputtering method a film in which the prescribed physical property is changed is deposited by changing deposition pressure in a range of 0.14 Pa to 1.4 Pa.

Preferably, in depositing the at least one electrode by a sputtering method a film in which the prescribed physical property is changed is deposited by changing deposition power density in a range of 0.25 W/cm$^2$ to 2.5 W/cm$^2$.

Preferably, in depositing the at least one electrode by a sputtering method a film in which the prescribed physical property is changed is deposited by changing deposition temperature in a range of 25° C. to 250° C.

Preferably, in depositing the at least one electrode by a sputtering method a film in which the prescribed physical property is changed is deposited by changing partial pressure of nitrogen gas in a range of 0.01 Pa to 0.14 Pa.

Preferably, in depositing the at least one electrode by a sputtering method a film in which the prescribed physical property is changed is deposited by changing partial pressure of oxygen gas in a range of 0.01 Pa to 0.14 Pa.

Preferably, after depositing the at least one electrode phosphrous ion is doped, so that prescribed physical property of a surface of the at least one electrode is changed and an etching rate of the at least one electrode is changed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1A:
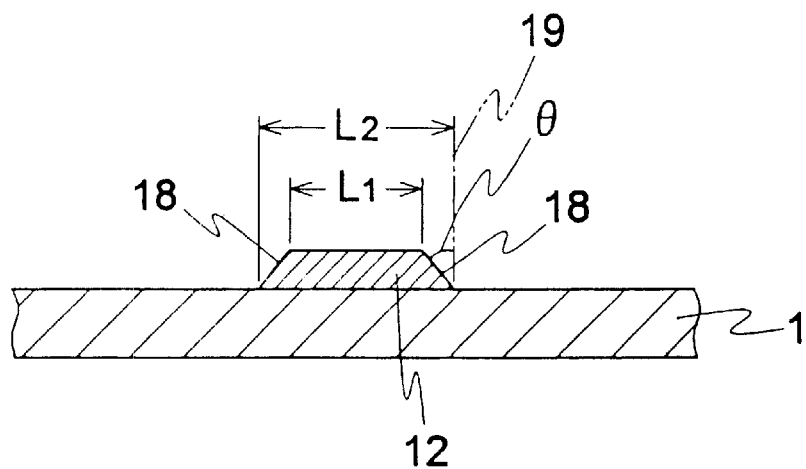
FIGS. 1(a) and 1(b) are sectional explanatory views showing TFT composition according to one embodiment of the present invention.
Figure 1B:
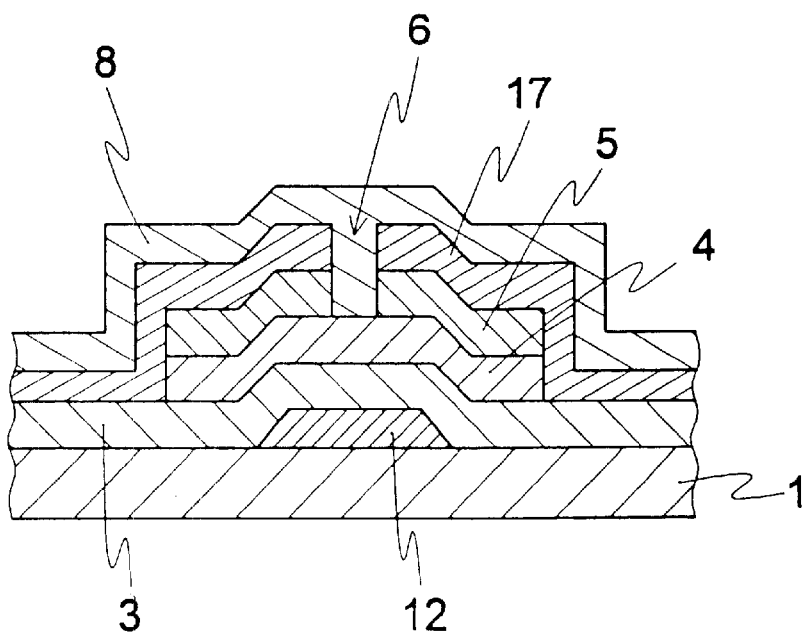

Referring now to the drawings, wherein like reference numerals designate identical or corresponding parts throughout the several views, and more particularly to FIGS. 1(a) and 1(b) therefore, there is illustrated a method of manufacturing a thin film transistor according to the invention.

A metallic film made of, for example, chrome is deposited by a sputtering method or the like on a substrate 1. In this deposition, first, a pressure for deposition (hereinafter, referred to as pressure) is made 0.27 Pa, a power for deposition (hereinafter referred to as power) which is power for causing plasma for deposition is made 10 kW. A deposition is conducted to 3000 Å through 3500 Å in thickness with a deposition temperature (hereinafter referred to as temperature) being 175° C. Then, a deposition operation is conducted to 1000 Å through 500 Å in thickness continuously under conditions of pressure of 0.14 Pa, power of 3 kW, and temperature of 175° C. Numeral values of conditions shown without numerical value range indicate central values, including variations accompanied in actual manufacturing operation (hereinafter the same). Conditions of pressure, power and so on can be changed gradually without interruption.

A deposition is conducted continuously or gradually, changing conditions in this manner.

As described above in an item of the conventional art, the word "continuously" indicates conducting a plurality of deposition steps continuously without taking out a semimanufactured product during a step from a deposition apparatus. The steps can be made shorter by reducing the frequency of a vacuum operation or a temperature rising operation and temperature lowering operation. The word "gradually" indicates taking out a semimanufactured product during a step from the deposition apparatus every time when the step conditions are changed; introducing it to a deposition apparatus again; and conducting a deposition operation. Without being restricted to the conditions of the previous step, an optional step conditions for obtaining desired characteristics can be set.

When a deposition is conducted continuously, electrode lines changed in conditions are in direct contact with each other forming an interface. When a deposition is conducted gradually, a film of an oxide (oxide film) of an electrode line material is slightly formed between the film layers of an electrode line changed in conditions. When a deposition is conducted gradually, a grade of forming an oxide film is let to be controlled. But in changing of the film quality, an extent of change of the film quality can be variably designed. In this specification, the word "film quality" means physical property of the film. The physical property includes, for example, atomic density, crystal orientation and sheet resistance as a parameter concretly. In any case, a prescribed physical property is changed in a film thickness-wise direction (the direction perpendicular to the surface of the film) so as to form an electrode line so that an etching rate of the electrode line is changed in a film thickness-wise direction. Thus, when the electrode line is etched, a progressing grade of an etching is different in the thickness-wise direction, so as to form a tapered face. Accordingly, a taper angle can be controlled even without frequent exchanging of etchant. Namely, a manufacturing cost required for exchanging etchant can be reduced.

A physical meaning in deposition by changing a film quality in a film thickness-wise direction in this manner is to change deposition conditions, i.e., deposition power density, deposition temperature and so on. As a result, atomic density and crystal orientation of a metallic film in a film thickness-wise direction are changed and further, bulk resistance is also changed. The change of physical property in a film thickness-wise direction in this manner means is different in etching rate when an etching operation is conducted. The physical amount of the atomic density and crystal orientation can be changed. If this change is to be made smaller in an etching rate when a portion is closer to the substrate, a metallic film suitable for various taper shapes can be formed. As bulk resistance can be changed, a change of the film quality can be understood through measuring bulk resistance by a simple method.

When an electrode line changed in an etching rate in a film thickness-wise direction is formed in this manner, a tapered face to be formed by a smaller etching rate through a portion closer to a substrate can be obtained simply by an etching operation.

From among a controlling operation of the conditions of an etching step conventionally conducted for controlling a taper angle θ (in FIG. 1(a)) of the electrode line within the range of the desired angle, a frequency of often exchanging a chemical etchant is reduced. Also, the number of targets to be used in a deposition step is reduced, so as to reduce a manufacturing cost. The taper angle θ is an angle between the tapered face and an imaginary line 19 perpendicular to the substrate 1. The line crosses to a point where the tapered face terminates on the substrate 1.

A method of forming an electrode line different in film quality in a film thickness-wise direction by changing an etching rate will be described in further detail.

Figure 2:
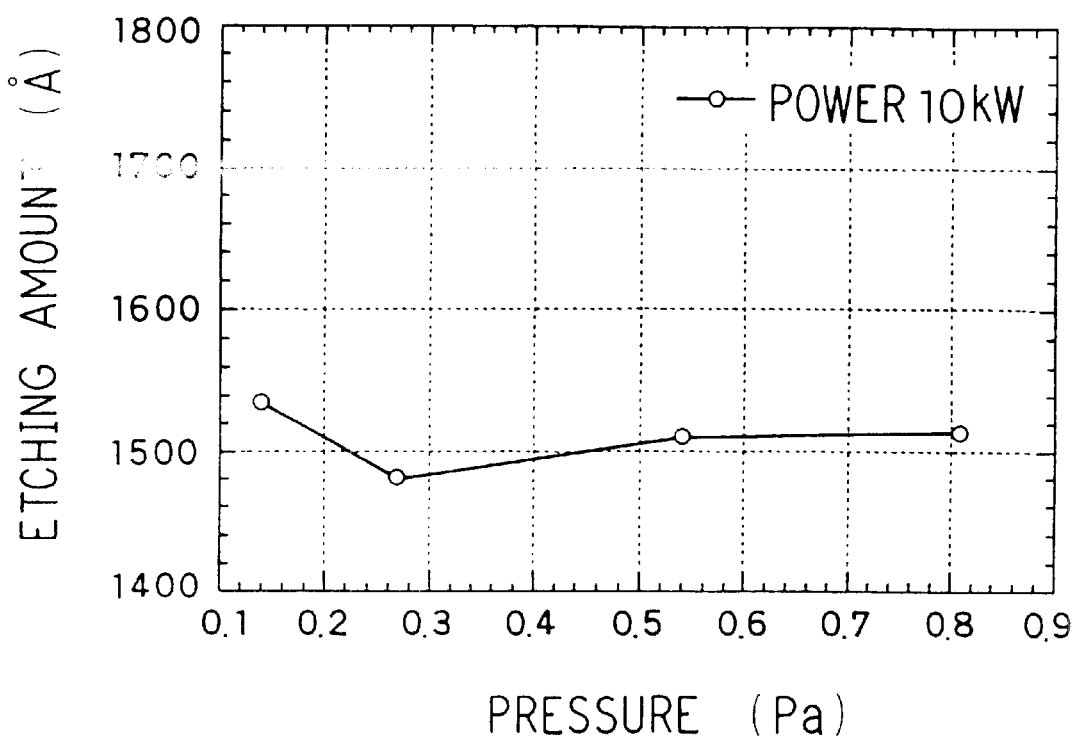
FIG. 2 is a dial showing relationship between deposition power and etching rate.
Figure 3:
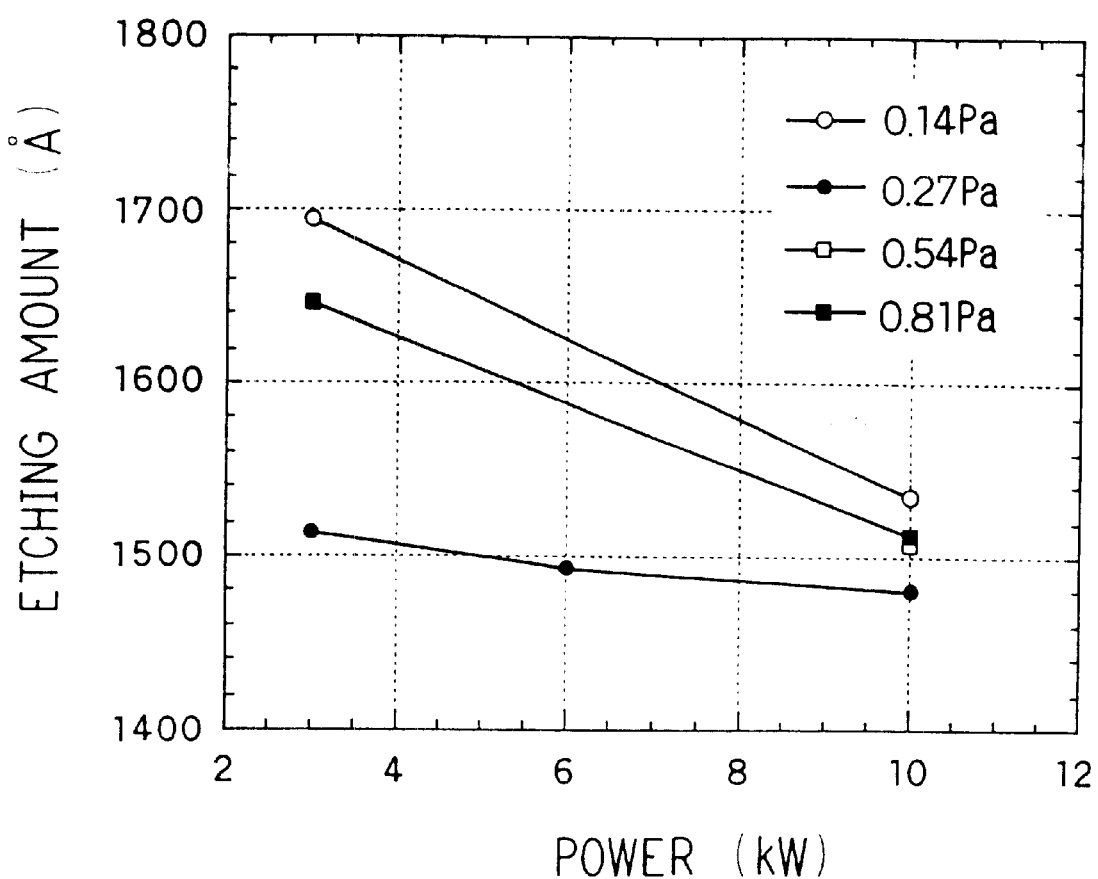
FIG. 3 is a diagram showing relationship between deposition power and etching rate.

Relationship between a deposition pressure and an etching rate of a chrome film is shown in FIG. 2. Relationship between deposition power and an etching rate is shown in FIG. 3. As shown in a graph of FIG. 2, the etching amount of a chrome film indicates a pressure higher than 0.27 Pa in pressure of 0.27 Pa with respect to change of the pressure, and a tendency slightly smaller than in a pressure lower than 0.27 Pa. As shown in FIG. 3, an etching amount of a chrome film indicates a tendency of reducing an etching amount when the power increases with respect to a change of power. This inclination indicates a similar tendency independently of a magnitude of a pressure. As a sputtering efficiency with respect to a deposition power is different depending on a target area to be used, the deposition power is generally expressed by the deposition power density per target area.

In this embodiment, an area indicates a data when a target of approximately 4000 $cm^2$ is used. Deposition power of 1 kW through 10 kW corresponds to 0.25 $W/cm^2$ through 2.5 $W/cm^2$ in a deposition power density (hereinafter the same).

Then, a desired pattern is formed by a photolithography step on a metallic film. Scattering a chemical etchant composed of ammonium cerium nitrate and perchloric acid by a spraying system or the like, an etching operation of an end face portion, arranging a taper angle by the corroding operation of the chemical etchant. A sectional shape forms a first electrode line 12 having a tapered face, as shown in FIG. 1(a), by an etching operation in this manner. A tapered face can be formed in this manner, because a film quality changes in a film thickness-wise direction, so that etching rate in a lateral direction is faster when upper layer in a portion not covered by a resist film. At this moment, a thickness (in a direction perpendicular to the film) decreases in a direction toward end face 18 of the first electrode line so that the length $L_1$ of a top portion is shorter ($L_2 > L_1$) than the length $L_2$ of a bottom portion of a first electrode line 12, as shown in FIG. 1(a). The first electrode line 12 is a gate electrode of a TFT.

By this manufacturing method, the exchanging frequency of the etchant is reduced to approximately ¼ as compared with that of the conventional art. Controlling the taper angle within a desired range means that it depends only upon a film quality from a viewpoint that film quality is changed when deposition conditions are changed. Thus, influences of impurities in chemical etchant like conventional one is lowered.

An insulating film 3 composed of silicon nitride or the like is formed to conduct a cleaning operation chemically or physically later. When cleaning operation is conducted physically, a cleaning operation is conducted by, for example, a scrubber. An a-Si semiconductor film 4 and an $n^+$ type a-Si semiconductor film 5 are formed on an insulating film 3. Then, a contact hole 6 is opened for forming a channel portion. Furthermore, later a second electrode line 17 is formed by a method similar to that of forming a first electrode line 12. Finally, a passivation film 8 is formed, and a TFT configuration shown in FIG. 1(a) is attained. One of the second electrode line 17 is made a source electrode, which is connected with a signal line. The other of the second electrode line 17 is made a drain electrode, which is connected with a pixel electrode. The source electrode is partially connected to $n^+$ type a-Si semiconductor film. The drain electrode is also partially connected to $n^+$ type a-Si semiconductor film.

As for such a TFT manufacturing method, a metallic material of a first electrode line 12 and a second electrode line 17 are formed by a sputtering method. A plurality of targets each different in composition are prepared, and a deposition is conducted sequentially from a material (target) slow in an etching rate. As an etching rate is different with respect to a film thickness-wise direction even in such a method, a first electrode line and a second electrode line having a taper of a desired taper angle are obtained. In this embodiment, in a deposition apparatus of capacity of approximately 50 litters and throughput of one piece, the range of a deposition pressure is made 0.14 Pa or more through 1.4 Pa or lower, and the range of deposition power is 1 kW or more through 10 kW or lower, with the range of the deposition temperature being 25° C. or more through 25° C. or lower. A reason why a lower limit of a deposition pressure is made 0.14 Pa and an upper limit is made 1.4 Pa is because deposition pressure depends upon structural conditions of achieving these deposition conditions by a general deposition apparatus without requirements of reconstruction and so on. A reason why a lower limit of deposition power is made 1 kW, and an upper limit is made 10 kW is because deposition power depends upon the aforementioned structural conditions of a general deposition apparatus. Furthermore, a reason why a bottom limit of a deposition temperature is made 25° C. and a top limit is made 250° C. is because deposition temperature depends upon the aforementioned structural conditions of the general deposition apparatus. In a range of pressure, power and temperature about such a deposition operation, better TFT characteristics can be obtained. When a film quality has to be changed gradually, with respect to a case where a film quality is changed continuously, deposition conditions can be easily set.

As a metallic material to be used as an electrode line having a desired taper angle by changing, the etching rate in a film thickness-wise direction in this manner can be used, in addition to chrome, aluminum, aluminum alloy, molybdenum, tantalum or titanium. These materials are low resistivity materials easily available. Even in these metallic materials, an etching rate is changed in a film thickness-wise direction and is etched, so as to obtain an electrode line having a desired taper angle. Therefore, concentration of chemical etchant in an etching operation is not necessary to be strictly controlled, thus achieving the same effect of reducing the frequency of the exchanging operation.

Embodiment 2

Among methods of manufacturing a TFT according to the embodiment 1, in depositing a metallic film, a temperature is made constant at 175° C. First, a thickness of 1000 Å is deposited under conditions of pressure of 0.27 Pa and power of 10 kW, then a thickness of 1000 Å is deposited under conditions of pressure of 0.81 Pa and power of 7 kW, continuously a thickness of 1000 Å is depositied under conditions of pressure 0.14 Pa and power of 5 kW, later a thickness of 1000 Å is deposited under conditions of pressure of 0.14 Pa and power of 3 kW. Other conditions except for conditions where a deposition is conducted with the temperature being constant and the pressure and the power being changed into four conditions are the same as those of the embodiment 1. The same effect is achieved even if a deposition is conducted continuously or gradually through changing the conditions in this manner.

Embodiment 3

First, among methods of manufacturing a TFT according to the embodiment 1, in depositing a metallic film, a thickness of 3000 Å through 3500 Å is deposited under conditions of pressure of 0.27 Pa, power of 10 kW, and temperature of 175° C., then nitrogen gas or oxygen gas is mixed into argon gas by 2% through 10% to conduct a deposition of 1000 Å through 500 Å under conditions of pressure of 0.27 Pa, power of 10 kW, and temperature of 175° C. The other conditions except for conditions where a deposition is conducted with pressure, power and temperature being constant, then nitrogen gas or oxygen gas is mixed with argon gas to conduct a deposition operation, are the same as those of the embodiment 1.

In this case, it is a case to further change the etching rate to use nitrogen gas and oxygen gas. To largely change the etching rate in this range, partial pressure provided in using nitrogen gas and oxygen gas is limited to 2% or more through 10% or lower. 2% or more through 10% or lower in range of partial pressure of the above mentioned nitrogen gas or oxygen gas, rewritten in expressions concerning pressure of down to two places of decimals, is 0.01 Pa or more through 0.14 Pa or lower.

Even in this embodiment, the word "continuously" and the word "gradually" are the same as those in the embodiments 1 and 2. For example, the partial pressure of nitrogen gas can be adopted in depositing continuously as, first, 0%, then 2%, and finally 10%. An effect same as that of the embodiment 1 can be obtained. Similarly, a deposition can be conducted gradually with, for example, the partial pressure of nitrogen gas being first 0%, then 2%, and finally 10%, further a deposition can be conducted by mixing nitrogen gas or oxygen gas from the beginning. An effect same as that of the embodiment 1 can be obtained in either case. A same effect can be achieved even when a deposition is conducted continuously or gradually, changing the conditions. Two divisional steps for deposition or four divisional steps for deposition or higher can be conducted although three divisional steps for deposition are shown in either case.

Embodiment 4

Among the methods of manufacturing a TFT according to the embodiment 1, when depositing of a metallic film, a first electrode line and a second electrode line are deposited in the same conditions. Even when the film quality of a metallic film is changed by an ion doping method, a similar effect can be achieved. Ion to be doped can be phosphorus, boron or nitrogen, and the dose amount can be approximately 5E12 through 5E17. When phosphorus is used, it is available, and a doping operation can be conducted with easy, and a film different in etching rate can be manufactured with ease.

Embodiment 5

When a deposition is conduced with proper combination of these deposition conditions with respect to a method of manufacturing TFTs according to each of the aforementioned embodiments 1 through 4, similar effects can be achieved.

Embodiment 6

The method of manufacturing TFTs according to each of the aforementioned embodiments 1 through 5 achieves the same effect even with respect to the second electrode line. In the TFTs according to the present invention, the second electrode line is made a source electrode and a drain electrode.

Coverage of a nitrogen film to be provided on the second electrode line and coverage of an ITO film to be provided on the nitrogen film are improved by tapering the second electrode line, thus improving reliability.

Embodiment 7

Figure 4:
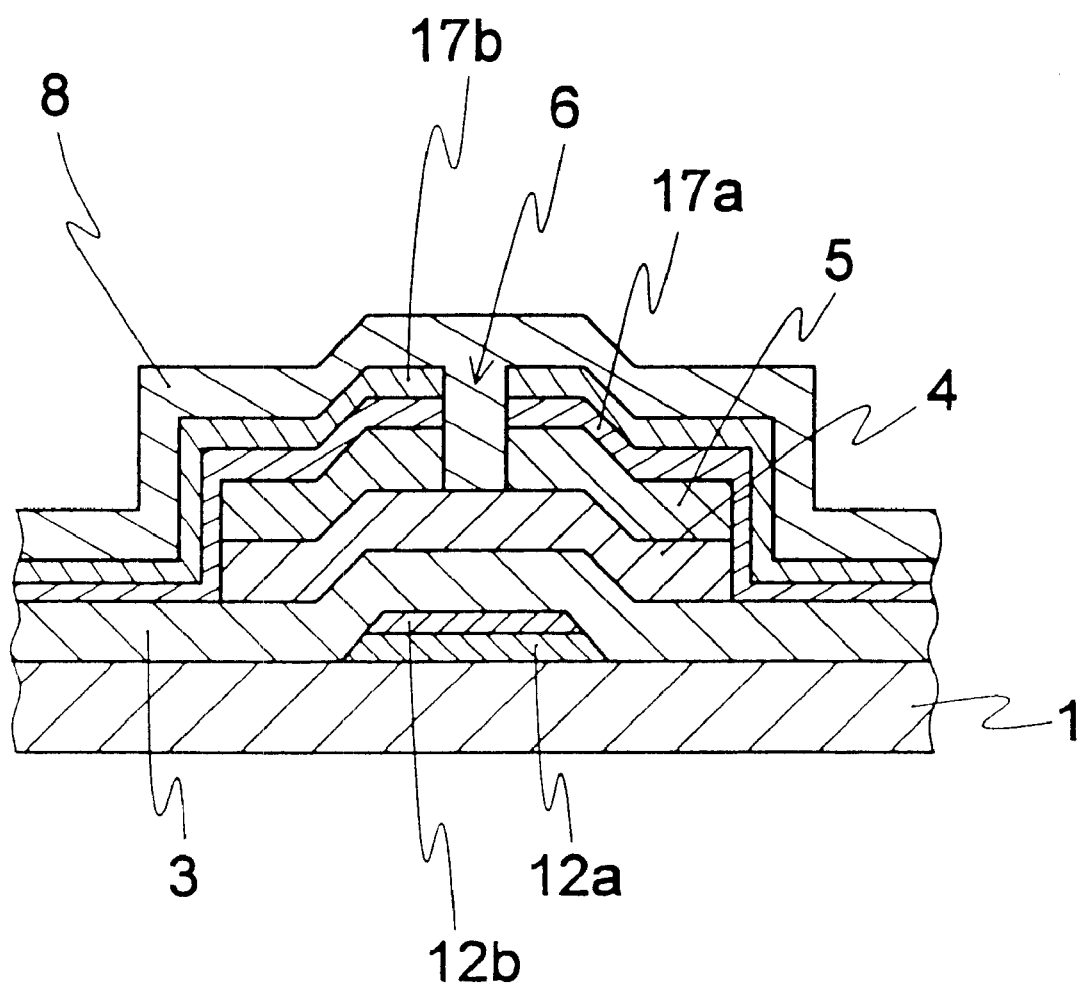
FIG. 4 is a section explanatory view showing a TFT composition according to other embodiment of the present invention.
Figure 5A:
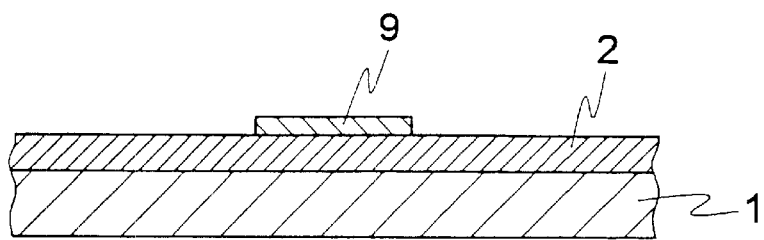
FIGS. 5(a) through 5(d) are sectional explanatory views showing TFT composition by conventional art.
Figure 5B:
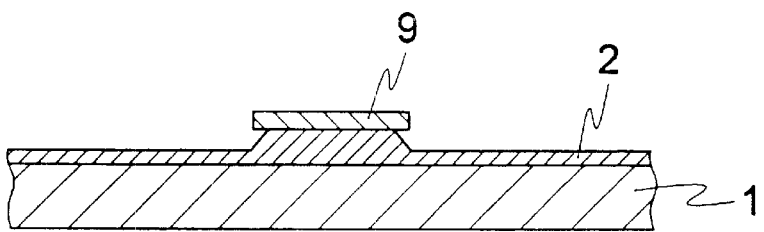
Figure 5C:
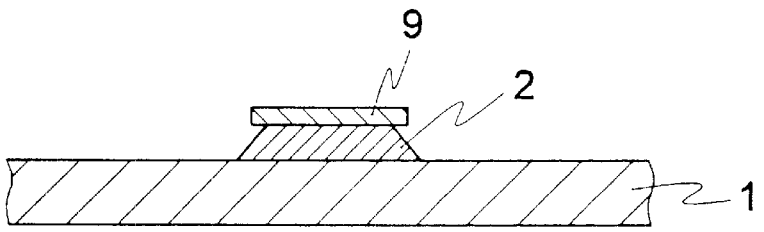
Figure 5D:
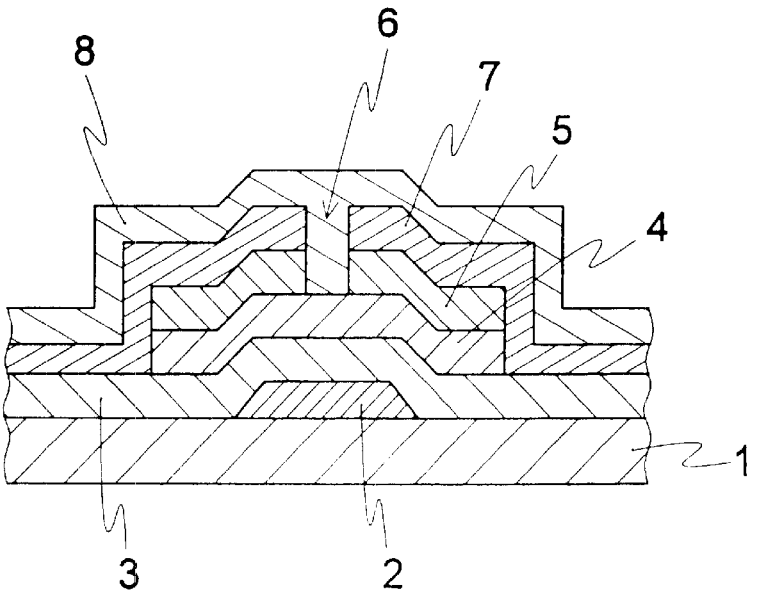

The method of manufacturing TFTs according to each of the aforementioned embodiments 1 through 5 achieves the same effect even with respect to the manufacturing of the electrode line composed of a plurality of layers. An electrode line composed of two-layer is shown in FIG. 4 as a example of a plurality of layers. FIG. 4 is a sectional explanatory drawing showing the composition of a TFT according to another embodiment of the present invention. Referring to the drawings, reference numeral 12a denotes a first electrode layer of a first electrode line, reference numeral 12b denotes a second electrode layer of a first electrode line, reference numeral 17a denotes a first electrode layer of a second electrode line, and reference numeral 17b denotes a second electrode layer of a second electrode line. The same reference numerals are given to the same parts as those of FIG. 1.

As shown in FIG. 4, for example, a first electrode line is composed of two layers, and film quality is changed in a thickness-wise direction according to a manufacturing method of either of each shown in the embodiments 1 through 5 with respect to the respective layers. Each of a plurality of electrode layers is composed of the same material, and each can be different respectively, allowing wide selection of designing the electrode line. At this moment, the film quality should be changed, so that the etching rate of the second electrode layer of an upper layer side higher than the first electrode layer of the lower layer side. The material and the manufacturing method to be used are the same as those of the embodiments 1 through 7, except that the electrode line is composed of at least two layers, thus achieving the same effect.

Embodiment 8

A TFT substrate manufactured in accordance with a TFT manufacturing method explained from the embodiments 1 through 7, and a liquid crystal display in which TFT substrate is employed will be described. In a TFT according to the present invention either of a TFT manufacturing methods according to each of the aforementioned embodiments 1 through 7 is empolyed. It is manufactured by the same method as the conventional ones, except for methods of manufacturing a gate electrode, a source electrode and a drain electrode.

The composition of a liquid crystal display apparatus in which a TFT substrate is employed according to the present invention and a method of manufacturing the TFT substrate is the same as the conventional art.

A TFT substrate according to the present invention, and a liquid crystal display apparatus in which such a TFT substrate is employed are formed in accordance with either of the TFT manufacturing methods explained in the embodiments 1 through 7, and the electrode line is changed in film quality in the film thickness-wise direction, thus achieving an outstanding effect of considerably reducing the manufacturing cost according to the taper formation.

In a thin film transistor according to the present invention, at least one electrode of a gate electrode, a source electrode and a drain electrode is made of the same material. The physical property of the above mentioned at least one electrode is changed in a film thickness-wise direction and an etching rate is changed in a film thickness-wise direction, so as to have an end face of one electrode as a tapered face of reducing the thickness towards the end face. Namely, the taper is formed by an etching operation. Thus, the controlling operation of a taper angle is not necessary to be conducted due to chemical etchant, and the frequency of exchanging the chemical etchant can be reduced (once/three days). Thus, an effect of considerably reducing the manufacturing cost can be achieved.

According to the present invention, an etching rate can be changed in a film thickness-wise direction to form an electrode line, because the physical property changes continuously in a film thickness-wise direction. Thus, as a tapered face can be formed with an extent in progressing of an etching in a film thickness-wise direction being different when the electrode line is etched, a taper angle can be controlled without exchanging the etchant frequently. Namely, an effect of reducing a manufacturing cost in exchanging of the etchant can be reduced.

According to the present invention, a metallic film suitable for various taper shape can be formed when an etching rate is changed so as to become smaller through becoming closer to the substrate, because the physical property changes in atomic density. To control a taper angle of an electrode line in a range of a desired angle, the frequency of chemical etchant exchanged often among the controlling operations of conditions of an etching step conventionally conducted is reduced or the number of targets to be used by a deposition step is reduced, thus achieving an effect of reducing the production cost.

According to the invention, a metallic film suitable for various taper shape can be formed when an etching rate is changed so as to become smaller through becoming closer to the substrate, because the physical property changes in a crystal orientation. To control a taper angle of an electrode line in a range of a desired angle, a frequency of exchanging chemical etchant among the controlling operations of conditions of an etching step conventionally conducted is reduced or the number of targets to be used by a deposition step is reduced, thus achieving an effect of reducing the production cost.

According to the present invention, a change of the physical property is a change of bulk resistance, thus achieving an effect of understanding a change of a physical property by observing the bulk resistance by a simple method.

According to the present invention, the physical property is changed gradually in a film thickness direction, so as to form an electrode line by changing the etching rate in the film thickness-wise direction. Thus, as a tapered face can be formed with an extent in progressing of an etching in a thickness-wise direction being different when the electrode line is etched, a taper angle can be controlled without exchanging the etchant frequently. Namely, an effect of reducing a manufacturing cost in exchanging of the etchant can be reduced. Although the necessity of controlling an extent of forming an oxide film is caused, an effect of designing extent of changing the physical property further variably.

According to the present invention, a metallic film suitable for various taper shape can be formed when an etching rate is changed so as to become smaller through becoming closer to the substrate, because the physical property changes in atomic density. To control a taper angle of an electrode line in a range of a desired angle, the frequency of chemical etchant exchanged often among the controlling operations of conditions of an etching step conventionally conducted is reduced or the number of targets to be used by a deposition step is reduced, thus achieving an effect of reducing the production cost.

According to the invention, a metallic film suitable for various taper shape can be formed when an etching rate is changed so as to become smaller through becoming closer to the substrate, because the physical property changes in a crystal orientation. To control a taper angle of an electrode line in a range of a desired angle, a frequency of exchanging chemical etchant among the controlling operations of conditions of an etching step conventionally conducted is reduced or the number of targets to be used by a deposition step is reduced, thus achieving an effect of reducing the production cost.

According to the present invention, a change of the physical property is a change of bulk resistance, thus achieving an effect of understanding a change of a physical property by observing the bulk resistance by a simple method.

According to the present invention, the etching rate of the electrode line is changed in a film thickness-wise direction, and an electrode line having a desired taper angle can be easily obtained by etching even when the electrode is made of either chrome, aluminum, aluminum alloy, molybdenum, tantalum, and titanium. Thus, density of chemical etchant in an etching operation is not necessary to strictly be controlled, thus achieving an effect of reducing the exchange frequency.

In a thin film transistor of the present invention, at least one electrode of a gate electrode, a source electrode and a drain electrode is made of at least two-layer of electrode layer, and each of the two-layer of electrode layers is formed with the same material. As the physical property is changed in a film thickness-wise direction, and the etching rate is changed in a film thickness-wise direction.

Thus, the end face of one electrode is made a tapered face in which a thickness decreases in a direction toward the end face. Namely, an effect is achieved of forming a taper by an etching operation even with respect to an electrode composed of multilayered electrode layers.

According to the present invention, the etching rate of the electrode line is changed in a film thickness-wise direction, and an electrode line having a desired taper angle can be easily obtained by etching even when the electrode is made of either chrome, aluminum, aluminum alloy, molybdenum, tantalum, and titanium. Thus, density of chemical etchant in an etching operation is not necessary to strictly be controlled, thus achieving an effect of reducing the exchange frequency.

A method of manufacturing a thin film transistor according to the present invention comprises steps of (a) changing the physical property of one electrode in a film thickness-wise direction, changing an etching rate in a film thickness-wise direction, so as to form one electrode, and (b) etching one electrode, so as to form the tapered face. Thus, a controlling operation of the taper angle is not necessary to conduct due to chemical etchant, thus reducing (once/three days) the exchange frequency of the chemical etchant. An effect of considerably reducing the manufacturing cost can be reduced.

According to the present invention, a film different in etching rate is deposited, changing a deposition pressure within a range. of 0.14 Pa or more though 1.4 Pa or lower. Therefore, an controlling operation within a desired range of a taper angle depends only upon film quality how the film quality is changed, and influences due to impurities in the conventional chemical etchant is lowered. As a result, the exchange frequency of the etchant is reduced to ¼ of conventional case or so with an effect of forming the tapered face with ease, obtaining a preferable TFT characteristic.

According to the present invention, a film different in etching rate is filmed, changing the deposition power density in a range of 0.25 W/cm$^2$ or more through 2.5 W/cm$^2$ or lower. Therefore, a controlling operation within a desired range of a taper angle depends only upon physical property how the physical property is changed, and influences due to impurities in the conventional chemical etchant is lowered. As a result, the exchange frequency of the etchant is reduced to ¼ of conventional case or so with an effect of forming the tapered face with ease, obtaining a preferable TFT characteristic.

According to the present invention, a film different in etching rate is deposited, changing the deposition temperature in a range of 25° C. or more through 250° C. or lower. Therefore, an controlling operation within a desired range of a taper angle depends only upon film quality how the physical property is changed, and influences due to impurities in the conventional chemical etchant is lowered. As a result, the exchange frequency of the etchant is reduced to ¼ of conventional case or so with an effect of forming the tapered face with ease, obtaining a preferable TFT characteristic.

According to the present invention, a film different in etching rate is deposited, changing nitrogen gas partial pressure in a range of 0.01 Pa or more through 0.14 Pa or lower. In this range, the etching rate of a film made in this range can be changed largely. The etching rate of a film made can be changed larger than in nitrogen gas not mixed. An effect of forming the tapered face with ease, obtaining a preferable TFT characteristic.

According to the present invention, a film different in etching rate is filmed, changing oxygen gas partial pressure in a range of 0.01 Pa or more through 0.14 Pa or lower. In this range, the etching rate of a film made in this range can be changed largely. The etching rate of a film can be changed larger than in oxygen gas not mixed. An effect of forming the tapered face with ease, obtaining a preferable TFT characteristic.

According to the present invention, after one electrode is deposited, the physical property of the surface of one electrode is changed by ion-doping of phosphorus. The respective electrodes are made a film different in etching rate in a film thickness-wise direction, thus achieving an effect of forming a tapered face with ease.

It should be understood that the apparatus and methods which have been shown and described herein are illustrative thereof. Clearly, those skilled in the art may conceive of variations for modifications to the invention. However, any such variations or modifications which fall within the purview of this descrition are intended to be included therein as well. The scope of the invention is limited only by the claims appended hereto.

What is claimed as new and desired to be secured by Letters Patent of the United States is:

1. A method of manufacturing a thin film transistor comprising:

a substrate, a gate electrode formed on said substrate;

an insulating film formed on said gate electrode and said substrate except for whole of outer surface of said gate electrode, a semiconductor film formed on said insulating film, a source electrode connected to said semiconductor film, and a drain electrode connected to said semiconductor film, wherein at least one of said gate electrode, said source electrode, and said drain electrode, is composed of one material, and the method of manufacturing comprises the steps of:

(a) changing an etching rate of said at least one electrode in a direction perpendicular to a top surface thereof by changing deposition conditions during a deposition step, and (b) etching said at least one electrode such that it is trapezoidal in its section;

wherein said changing step includes either (i) changing a deposition pressure, (ii) changing a deposition power, (iii) changing a deposition temperature, (iv) changing a partial pressure of nitrogen gas relative to argon gas of a deposition gas stream, or (v) doping a deposition gas stream with phosphorous ions.

2. The method of manufacturing the TFT of claim 1 further comprising the step of forming said at least one electrode using a sputtering method, wherein said prescribed physical property is changed by changing the deposition pressure in a range of 0.14 Pa to 1.4 Pa.

3. The method of manufacturing the TFT of claim 1 further comprising the step of forming said at least one electrode using a sputtering method, wherein said prescribed physical property is changed by changing the deposition power density in a range of 0.25 W/cm$^2$ to 2.5 W/cm$^2$.

4. The method of manufacturing the TFT of claim 1 further comprising the step of forming said at least one electrode using a sputtering method, wherein said prescribed physical property is changed by changing the deposition temperature in a range of 25° C. to 250° C.

5. The method of manufacturing the TFT of claim 1 further comprising the step of forming said at least one electrode using a sputtering method, wherein said prescribed physical property is changed by changing the partial pressure of nitrogen gas in a range of 0.01 Pa to 0.14 Pa.

6. The method of manufacturing the TFT of claim 1 wherein said deposition gas stream further comprises oxygen gas and further comprising the step of forming said at least one electrode using a sputtering method, said prescribed physical property is changed by changing the partial pressure of oxygen gas in a range of 0.01 Pa to 0.14 Pa.

7. The method of manufacturing the TFT of claim 1 further comprising the step of forming said at least one electrode using a sputtering method, wherein after depositing said at least one electrode, the phosphorous ion is doped so that said prescribed physical property of a surface of said at least one electrode is changed and an etching rate of said at least one electrode is changed.

* * * * *